(12) United States Patent
Iwasaka et al.

(10) Patent No.: US 10,189,166 B2
(45) Date of Patent: Jan. 29, 2019

(54) SUCTION EQUIPMENT

(71) Applicant: HARMOTEC CO., LTD., Kofu, Yamanashi (JP)

(72) Inventors: Hitoshi Iwasaka, Kofu (JP); Hideyuki Tokunaga, Kofu (JP); Yuji Kasai, Kofu (JP)

(73) Assignee: HARMOTEC CO., LTD., Kofu (JP)

( * ) Notice: Subject to any disclaimer, the term of this patent is extended or adjusted under 35 U.S.C. 154(b) by 0 days.

(21) Appl. No.: 15/553,974

(22) PCT Filed: Feb. 29, 2016

(86) PCT No.: PCT/JP2016/055972
§ 371 (c)(1),
(2) Date: Aug. 25, 2017

(87) PCT Pub. No.: WO2016/140171
PCT Pub. Date: Sep. 9, 2016

(65) Prior Publication Data
US 2018/0065257 A1   Mar. 8, 2018

(30) Foreign Application Priority Data

Mar. 3, 2015   (JP) ................................. 2015-041426

(51) Int. Cl.
*B25J 15/06* (2006.01)
*H01L 21/67* (2006.01)
(Continued)

(52) U.S. Cl.
CPC ........ *B25J 15/0683* (2013.01); *B65G 49/061* (2013.01); *H01L 21/67086* (2013.01);
(Continued)

(58) Field of Classification Search
CPC .......... H01L 21/6838; H01L 21/67086; H01L 21/67092; H01L 21/67766;
(Continued)

(56) References Cited

U.S. PATENT DOCUMENTS 5,067,762 A * 11/1991 Akashi ................. B25J 15/0616
271/97
6,467,297 B1 * 10/2002 Bollinger .............. H01L 21/223
156/345.1
(Continued)

FOREIGN PATENT DOCUMENTS

CN   101872734 A   10/2010
JP   S63-051446 U   4/1988
(Continued)

OTHER PUBLICATIONS

Jan. 20, 2016 Office Action issued in Japanese Patent Application No. 2015-041426.
(Continued)

*Primary Examiner* — Stephen A Vu
(74) *Attorney, Agent, or Firm* — Oliff PLC

(57) ABSTRACT

Suction equipment 10 is provided with a swirl flow-forming body 1, a baffle plate 2, and connecting members 3 that connect swirl flow-forming body 1 and baffle plate 2. Baffle plate 2 obstructs a member W to which suction is applied from entering a concave part 12 provided in swirl flow-forming body 1. Connecting members 3 form, between end face 13 and baffle plate 2, a flow path for fluid to flow out of concave part 12.

8 Claims, 10 Drawing Sheets

(51) Int. Cl.
*H01L 21/677* (2006.01)
*H01L 21/683* (2006.01)
*B65G 49/06* (2006.01)

(52) U.S. Cl.
CPC .. *H01L 21/67092* (2013.01); *H01L 21/67712* (2013.01); *H01L 21/67766* (2013.01); *H01L 21/67778* (2013.01); *H01L 21/67781* (2013.01); *H01L 21/6838* (2013.01); *B65G 2201/022* (2013.01); *B65G 2249/045* (2013.01)

(58) Field of Classification Search
CPC ......... H01L 21/67778; H01L 21/67781; H01L 21/67712; B25J 15/0616; B25J 15/0683; B65G 49/061; B65G 2201/022; B65G 2249/045
See application file for complete search history.

(56) References Cited

U.S. PATENT DOCUMENTS

| | | | | |
|---|---|---|---|---|
| 7,452,016 B2* | 11/2008 | Tanae | ................... | B65G 47/911 |
| | | | | 294/64.3 |
| 7,510,226 B2* | 3/2009 | Akiyama | ............. | B65G 49/061 |
| | | | | 294/64.3 |
| 7,597,370 B2* | 10/2009 | Tanae | ..................... | B65G 47/91 |
| | | | | 294/64.3 |
| 7,690,869 B2* | 4/2010 | Yo | ........................ | B65G 49/061 |
| | | | | 269/20 |
| 2003/0033728 A1 | 2/2003 | Iwasaka et al. | | |
| 2010/0264679 A1 | 10/2010 | Moriya | | |
| 2011/0061999 A1 | 3/2011 | Cho | | |

FOREIGN PATENT DOCUMENTS

| | | |
|---|---|---|
| JP | H07-088792 A | 4/1995 |
| JP | 2005-051260 A | 2/2005 |
| JP | 2011-521793 A | 7/2011 |

OTHER PUBLICATIONS

Sep. 28, 2016 Office Action issued in Korean Patent Application No. 10-2016-7022158.

Feb. 15, 2017 Office Action issued in Taiwanese Patent Application No. 105106342.

Feb. 24, 2017 Office Action issued in Korean Patent Application No. 10-2016-7022158.

Apr. 5, 2016 International Search Report issued in International Patent Application No. PCT/JP2016/055972.

* cited by examiner (a)

(b)

SUCTION EQUIPMENT

TECHNICAL FIELD

The present invention pertains to equipment that applies suction to a material to which it is difficult to apply suction.

BACKGROUND ART

In recent years, equipment for conveying a plate-like member such as a semiconductor wafer or a glass substrate in a non-contact manner has been developed. For example, in Patent Document 1, equipment is proposed for conveying a plate-like member in a non-contact manner, by applying Bernoulli's principle. The equipment includes a cylindrical chamber that opens on the underside of the equipment, into which fluid is supplied to generate a swirl flow. The swirl flow generates a negative pressure in the centre, which exerts suction on the plate-like member. On the other hand, a fluid flowing out of the cylindrical chamber causes a given distance to be maintained between the equipment and the plate-like member. Consequently, the equipment conveys the plate-like member in a non-contact manner.

PRIOR ART DOCUMENT

Patent Document

Patent Document 1: JP 2005-51260 A1

SUMMARY OF THE INVENTION

Problems to be Solved by the Invention

It is an object of the present invention to enable suction equipment to apply suction to a member in a stable manner, which suction equipment applies suction to the member by forming a swirl flow or radial flow in a concave part to generate negative pressure while preventing the member from entering a concave part.

Means for Solving the Problems

To solve the problem described above, the present invention provides suction equipment, comprising: a columnar main body; a flat end face formed at the main body; a concave part formed at the end face; a fluid flow-forming means for forming a fluid swirl flow in the concave part or forming a radial flow by discharging fluid into the concave part, the fluid swirl flow or the radial flow generating negative pressure that applies suction to a member; a baffle plate that allows a fluid to which suction is applied due to the negative pressure pass through while preventing the member from entering the concave part, and one or more support members that support the baffle plate so that the baffle plate opposes the concave part, and that form, between the end face and the baffle plate, a flow path for fluid to flow out of the concave part.

In a preferred mode of the invention the one or more support members may project from the end face and connect the main body and the baffle plate, and the one or more support members may be arranged such that the one or more support members do not obstruct the flow path.

In another preferred mode of the invention the one or more support members may connect a bottom surface of the concave part and the baffle plate.

In a further preferred mode of the invention the baffle plate may comprise a concave part or an opening into which a part of the member enters so that a position of the member is determined.

In a further preferred mode of the invention the one or more support members may support the baffle plate so that the baffle plate opposes the concave part and the end face, and form the flow path in a space between the end face and the baffle plate.

In a further preferred mode of the invention all of the one or more support members provided in the suction equipment may be arranged in positions such that none of the one or more support members obstructs the flow path.

In a further preferred mode of the invention the baffle plate may comprise a mesh part having a concave part in the centre.

Effects of the Invention

The present invention enables suction equipment to apply suction to a member in a stable manner, which suction equipment applies suction to the member by forming a swirl flow or radial flow in a concave part to generate negative pressure while preventing the member from entering a concave part.

DESCRIPTION OF REFERENCE NUMERALS

1 . . . swirl flow-forming body, 2 . . . baffle plate, 3 . . . connecting member, 4 . . . radial flow-forming body, 10 . . . suction equipment, 11 . . . main body, 12 . . . concave part, 13 . . . end face, 14 . . . jetting port, 15 . . . incline surface, 16 . . . supply port, 17 . . . annular passage, 18 . . . communication passage, 19 . . . supply path, 20 . . . conveyance equipment, 21 . . . disk part, 22 . . . rod-like member, 23 . . . annular member, 24 . . . mesh part, 25 . . . mesh part, 30 . . . conveyance equipment, 41 . . . main body, 42 . . . annular concave part, 43 . . . end face, 44 . . . facing surface, 45 . . . incline surface, 46 . . . nozzle hole, 47 . . . introduction port, 48 . . . introduction path, 49 . . . annular passage, 50 . . . communication passage, 111 . . . convex part, 201 . . . substrate, 202 . . . friction member, 203 . . . hole, 211 . . . opening, 212 . . . regulation part, 251 . . . concave part, 301 . . . substrate, 3011 . . . gripping part, 3012 . . . arm

MODES FOR IMPLEMENTING THE INVENTION

The mode for carrying out the present invention is explained below with reference to the drawings.

1. EMBODIMENT

Figure 1:
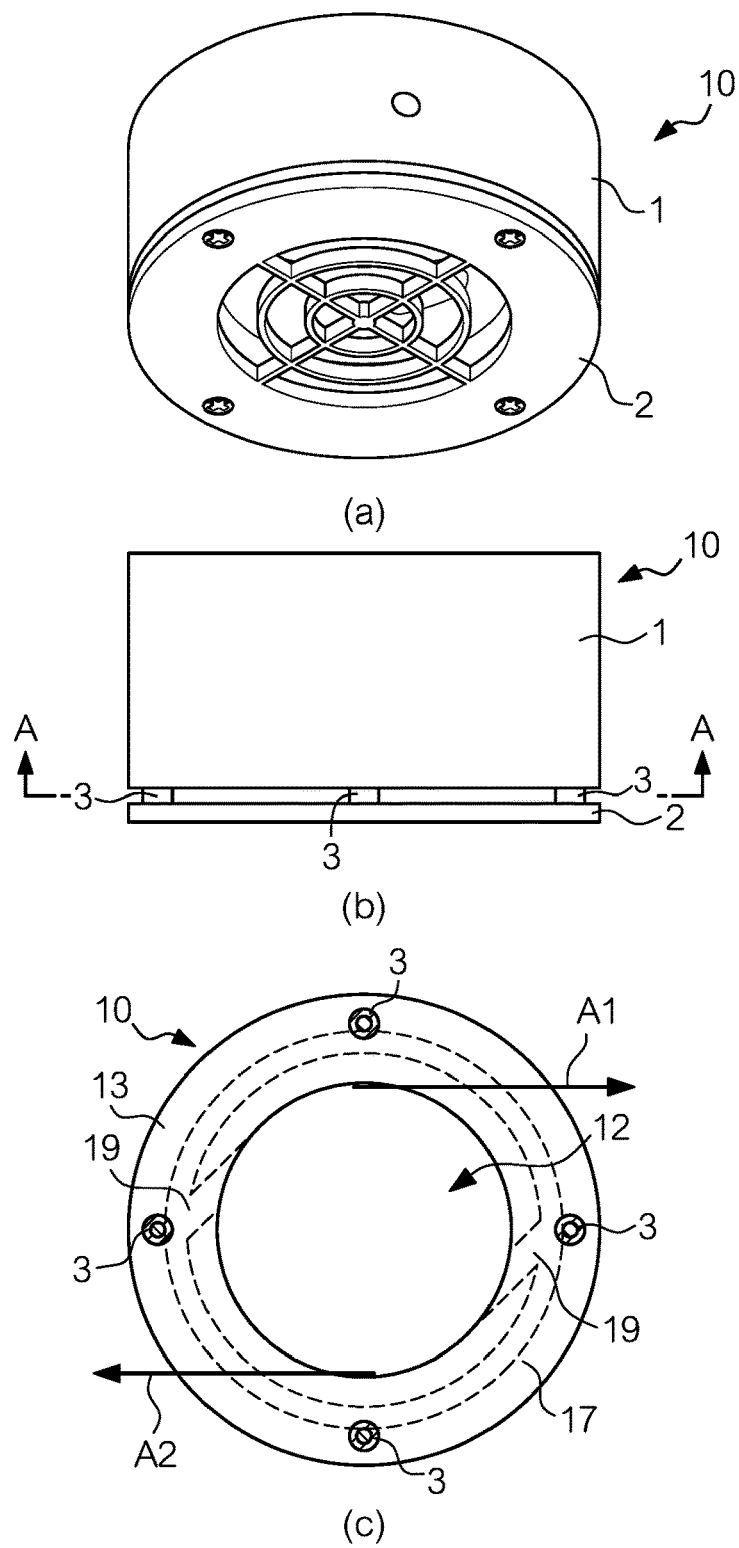
FIG. 1 is a drawing illustrating one example of the structure of suction equipment 10.

FIG. 1 is a drawing illustrating one example of the structure of suction equipment 10 as in one embodiment of the present invention. FIG. 1(a) is a perspective view of suction equipment 10, FIG. 1(b) is a side view of suction equipment 10, and FIG. 1(c) is a cross-sectional view of FIG. 1(b) along line A-A. Suction equipment 10 illustrated in FIG. 1 is equipment for applying suction to and holding a plate-like member such as a semiconductor wafer or a glass substrate and conveying the plate-like member. Suction equipment 10 is also equipment for applying suction to and holding a material to which it is difficult to apply suction to convey the material. Here, a material to which it is difficult to apply suction is a material that is soft, has permeability or is heavy. Specifically, the material is a film-like material such as tissue paper, film for wrapping food or metal foil. The material may also be a sheet-like food material such as sheet-like nori or sheet-like thin omelette (before cutting). The material may also be an easily breakable and fragile ultrathin semiconductor wafer or an ultrathin glass substrate. The material to which it is difficult to apply suction may be magnetic or nonmagnetic.

Suction equipment 10, as illustrated in FIG. 1, is provided with a swirl flow-forming body 1, a baffle plate 2, and four connecting members 3 that connect swirl flow-forming body 1 and baffle plate 2. Swirl flow-forming body 1 is equipment that applies suction to a member W. Baffle plate 2 is a member that prevents member W, to which suction is applied by swirl flow-forming body 1, from entering a concave part 12 described below, while allowing a fluid to which suction is applied due to negative pressure generated within concave part 12 to pass through.

Figure 2:
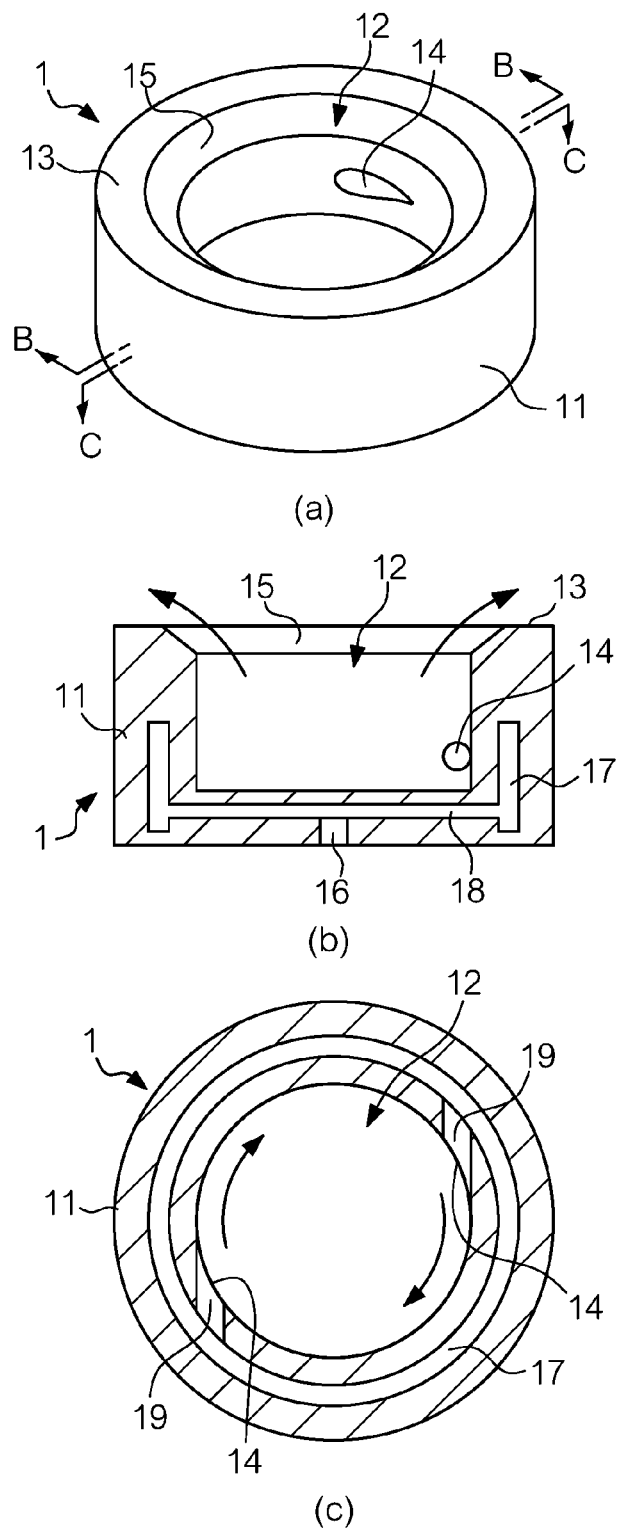
FIG. 2 is a drawing illustrating one example of the structure of a swirl flow-forming body 1.

FIG. 2 is a drawing illustrating one example of the structure of swirl flow-forming body 1. FIG. 2(a) is a perspective view of swirl flow-forming body 1, FIG. 2(b) is a cross-sectional view of FIG. 2(a) along line B-B, and FIG. 2(c) is a cross-sectional view of FIG. 2(a) along line C-C. Swirl flow-forming body 1 applies suction to and holds the member in a non-contact manner using Bernoulli's principle, and conveys the member. Specifically, swirl flow-forming body 1 generates negative pressure within concave part 12 by discharging a fluid into concave part 12, which negative pressure applies suction to and holds member W. Here, the fluid is a gas such as compressed air or a liquid such as pure water or carbonated water. The material of swirl flow-forming body 1 is an aluminium alloy for example.

Swirl flow-forming body 1, as illustrated in FIG. 2, is provided with a main body 11, a concave part 12, an end face 13, two jetting ports 14 and an incline surface 15. Main body 11 has a column shape. End face 13 is formed in a flat shape on one of the surfaces (specifically, the surface that deals with member W) (hereafter referred to as "bottom surface") of main body 11. Concave part 12 has a column shape and is formed on end face 13. Concave part 12 is formed on the same axis as main body 11.

Two jetting ports 14 are formed on the inner-peripheral side surface that faces concave part 12 of main body 11. Two jetting ports 14 are arranged in the centre of the inner-peripheral side surface in the axial direction. Two jetting ports 14 are arranged so as to be in mutual opposition to each other. Specifically, jetting ports 14 are arranged in point symmetry about the axial centre of the central axis of main body 11 or concave part 12. The fluid supplied to swirl flow-forming body 1 is discharged into concave part 12 via each of jetting ports 14. Incline surface 15 is formed on the opening end of main body 11.

Swirl flow-forming body 1, as illustrated in FIG. 2, is also provided with a supply port 16, an annular passage 17, a communication passage 18, and two supply paths 19. Supply port 16 has a disk shape and is provided in the centre of the top surface (that is, the surface opposite the bottom surface) of main body 11. Supply port 16 is connected to a fluid supply pump, which is not illustrated, via a tube, for example. Main body 11 is supplied with a fluid therewithin via this supply port 16. Annular passage 17 has a cylindrical shape, and is formed inside main body 11 so as to surround concave part 12. Annular passage 17 is formed on the same axis as concave part 12. Annular passage 17 supplies supply path 19 with fluid supplied from communication passage 18. Communication passage 18 is provided inside main body 11, and extends in the radial direction of the bottom surface or top surface of main body 11 in a straight line.

Communication passage 18 communicates, at both ends thereof, with annular passage 17. Communication passage 18 supplies annular passage 17 with the fluid that is supplied into main body 11 via supply port 16. Two supply paths 19 are formed so as to be approximately parallel to end face 13 and to extend in a direction tangential to the outer periphery of concave part 12. Two supply paths 19 extend parallel to each other. Each of supply paths 19 communicates with annular passage 17 at one end thereof, and communicates with jetting port 14 at the other end thereof. Each of supply paths 19 forms a swirl flow of fluid within concave part 12. Each of supply paths 19 is one example of the "fluid flow forming means" as in the present invention.

Figure 3:
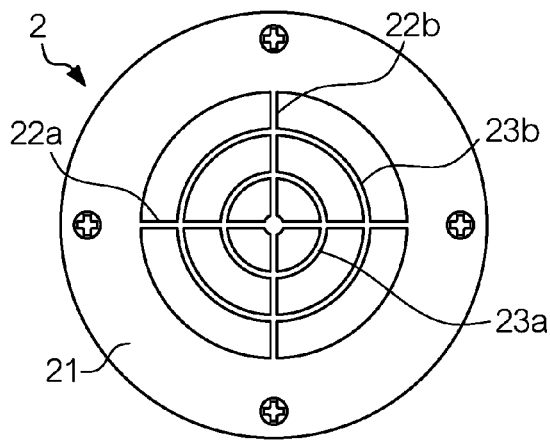
FIG. 3 is a plane view of a baffle plate 2.

Next, FIG. 3 is a plane view of baffle plate 2. Baffle plate 2, as illustrated in FIG. 3, is a resin flat plate having a disk shape. Baffle plate 2 is attached to swirl flow-forming body 1 via connecting members 3 so as to have the same centre as and be parallel to end face 13. For example, baffle plate 2 is attached to swirl flow-forming body 1 by screwing. Baffle plate 2, as illustrated in FIG. 3, has a disk part 21 having a disk-shaped opening, a plurality of rod-like members 22a, 22b (hereafter collectively referred to as "rod-like member 22") that stretch over the opening of disk part 21, and a plurality of annular members 23a, 23b (hereafter collectively referred to as "annular member 23") that stretch between rod-like members 22a and 22b.

When baffle plate 2 is attached to swirl flow-forming body 1, one surface of disk part 21 opposes end face 13 of swirl flow-forming body 1. Rod-like members 22a and 22b extend so as to intersect in the centre of the opening of disk part 21. Rod-like members 22a and 22b extend across the opening of concave part 12 when baffle plate 2 is attached to swirl flow-forming body 1. Rod-like members 22a and 22b extend so as to form a cross, for example. Annular members 23a and 23b form concentric circles whose centre is the point at which rod-like members 22a and 22b cross.

A gap is provided between the innermost annular member 23a and the intersection of rod-like members 22a and 22b. That is, annular member 23a is provided so as not to cover the central part of the opening of concave part 12 when baffle plate 2 is attached to swirl flow-forming body 1.

Therefore, annular member 23a does not obstruct the inflow of fluid that is sucked into concave part 12, for the reasons described below.

Next, connecting members 3 are columnar spacers. One surface of connecting members 3 is fixed to end face 13, and the other surface is fixed to one surface (specifically, the surface on the side that opposes end face 13) of baffle plate 2. As a result, main body 11 and baffle plate 2 are connected via connecting members 3. Connecting members 3 project from end face 13 and extend vertically towards baffle plate 2. These connecting members 3 are one example of support members that support baffle plate 2 so that the baffle plate opposes concave part 12.

Connecting member 3 forms, between end face 13 and baffle plate 2, a flow path for fluid to flow out of concave part 12. This flow path is formed parallel to end face 13 and baffle plate 2, and the fluid that flows out of concave part 12 flows along this flow path (that is, flows parallel to end face 13 and the surface of disk part 21) before flowing outside suction equipment 10. Fluid that passes through this flow path does not flow out of the opening of baffle plate 2.

The height of connecting members 3 (that is, the gap between end face 13 and baffle plate 2) is set in accordance with the flow amount of the fluid supplied from a fluid supply pump to suction equipment 10. For example, the height is set so that the fluid that flows out of concave part 12 passes through the flow path formed between end face 13 and baffle plate 2 by connecting members 3 without passing through the opening of baffle plate 2. At this time, the height of connecting members 3 is preferably as low as possible so that the suction power of suction equipment 10 does not decrease.

Connecting members 3 are arranged in positions so as not to obstruct the flow path formed between end face 13 and baffle plate 2 by the members. In other words, connecting members 3 are arranged in positions in which flow paths are not formed (or positions in which flow amount is smaller than in other positions). Specifically, as illustrated in FIG. 1(c), connecting members 3 are arranged in positions that do not cross the flow path indicated by arrow A1 or A2. This is to prevent turbulent flow from occurring due to collision of the fluid that flows out of concave part 12 and connecting members 3. The flow path of the fluid that flows out of concave part 12 is determined by the diameter or depth of concave part 12 and flow speed of the fluid. Here, the flow path is represented by a synthetic vector of the fluid that flows out of concave part 12, for example.

If swirl flow-forming body 1 is supplied with fluid via supply port 16 as explained above, the fluid passes through communication passage 18, annular passage 17 and supply paths 19 before being discharged from jetting ports 14 into concave part 12. The fluid discharged into concave part 12 is rectified as swirl flow within concave part 12, and subsequently flows out of the opening of concave part 12. At this time, if a member W is present in a position that opposes baffle plate 2, inflow of external fluid (for example, air or water) to concave part 12 is limited, and the density of fluid molecules per unit volume in the centre of the swirl flow becomes reduced due to centrifugal force and entrainment effect of the swirl flow, generating negative pressure within concave part 12. As a result, pressure is applied to member W by surrounding fluid and member W gravitates towards suction equipment 10.

Figure 4:
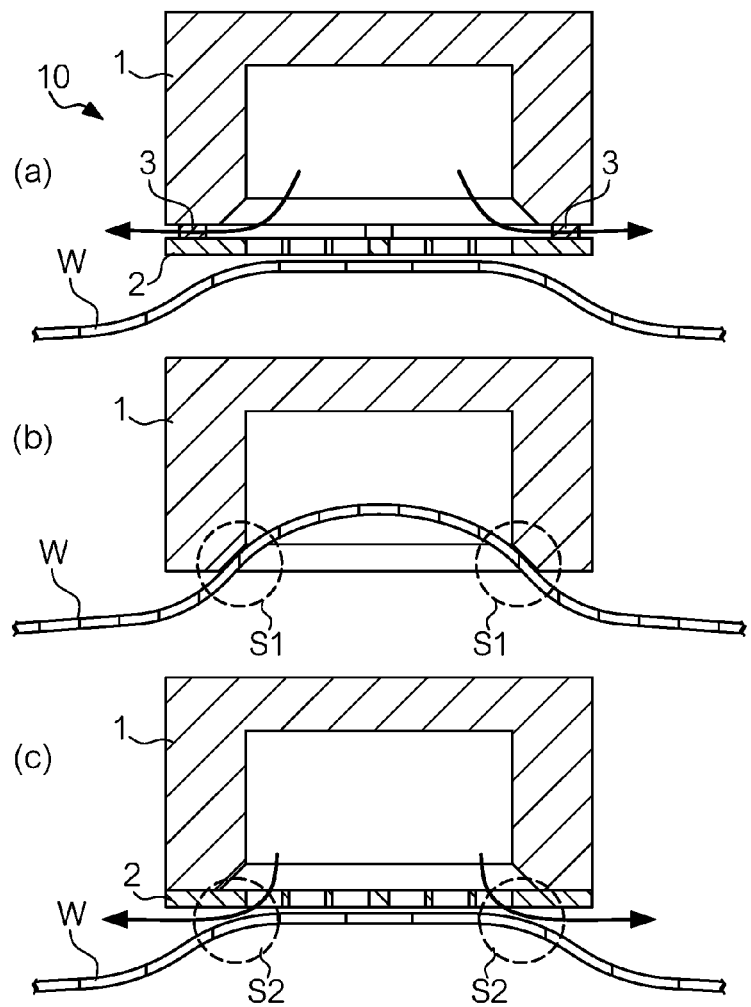
FIG. 4 is an explanatory diagram of the effects of suction equipment 10.

If member W is a material to which it is difficult to apply suction, there is no option other than to increase the suction force to the material, and as a result, the material comes into contact with suction equipment 10. In such a case, as illustrated in FIG. 4(b), if baffle plate 2 is not present, member W is sucked into concave part 12. As a result, member W and the opening edge of concave part 12 (in particular, incline surface 15) come into contact with each other (refer to dotted line region S1), causing member W to become scratched or marked. On the other hand, in suction equipment 10 as in the present embodiment, since baffle plate 2 is present, as illustrated in FIG. 4(a), member W is not sucked into concave part 12.

Even if, for example, baffle plate 2 is present, if baffle plate 2 is directly attached to swirl flow-forming body 1, member W to which suction is applied by suction equipment 10 undulates. This is because, when baffle plate 2 is directly attached to swirl flow-forming body 1, as illustrated in FIG. 4(c), the fluid that flows out of concave part 12 must exit from the opening in baffle plate 2, and as a result, the fluid collides with member W (refer to dotted line region S2). If member W undulates, stable suction, holding and conveyance are obstructed, and sometimes member W becomes creased, deformed or damaged. In contrast, in suction equipment 10 as in the present embodiment, since a flow path is formed by connecting members 3 between end face 13 and baffle plate 2, as illustrated in FIG. 4(a), the fluid that flows out of concave part 12 flows out of suction equipment through this flow path without passing through the opening of baffle plate 2. Therefore, in this suction equipment 10, collision of the fluid that flows out of concave part 12 and member W is controlled, and as a result, undulation of member W is controlled. As a result of the control of collision of the outflow fluid and member W, rotation of member W caused by the outflow fluid is controlled. As such, connection members 3 make possible use of the suction force of the swirl flow that occurs within swirl flow-forming body 1 in isolation.

2. MODIFIED EXAMPLES

The embodiment described above may be modified as described below. Further, the below modified examples may be combined.

2-1. Modified Example 1

Figure 5:
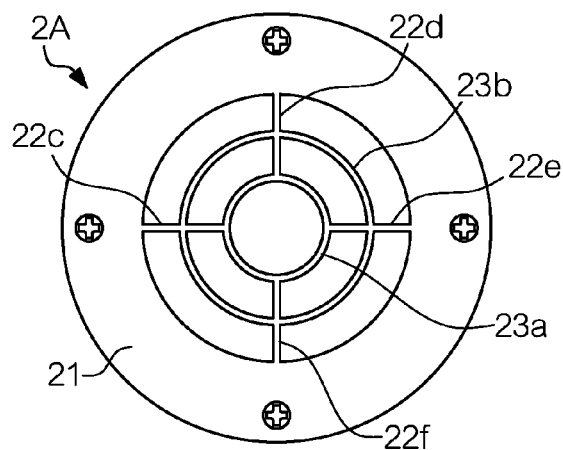
FIG. 5 is a plane view of a baffle plate 2A.

The shape of baffle plate 2 is not limited to the shape adopted in the embodiment described above. For example, as illustrated in FIG. 5, a shape in which rod-like members 22a and 22b are cut out in the region inside annular member 23a arranged on the innermost side of baffle plate 2 as in the embodiment described above may be adopted. A baffle plate 2A having this shape, as illustrated in FIG. 5, has a disk part 21, rod-like members 22c, 22d, 22e and 22f, and annular members 23a and 23b.

Rod-like members 22c, 22d, 22e and 22f are the same length, each extending from the edge of the opening of disk part 21 towards the centre of the opening thereof. Each of rod-like members 22c, 22d, 22e and 22f extends perpendicularly with respect to adjacent rod-like members. Annular member 23a is arranged so that the outer-peripheral edge thereof comes into contact with the tip of each of the rod-like members 22c, 22d, 22e and 22f. Annular member 23b stretches between each of the rod-like members 22c, 22d, 22e and 22f so as to be concentric with annular member 23a.

2-2. Modified Example 2

Figure 6:
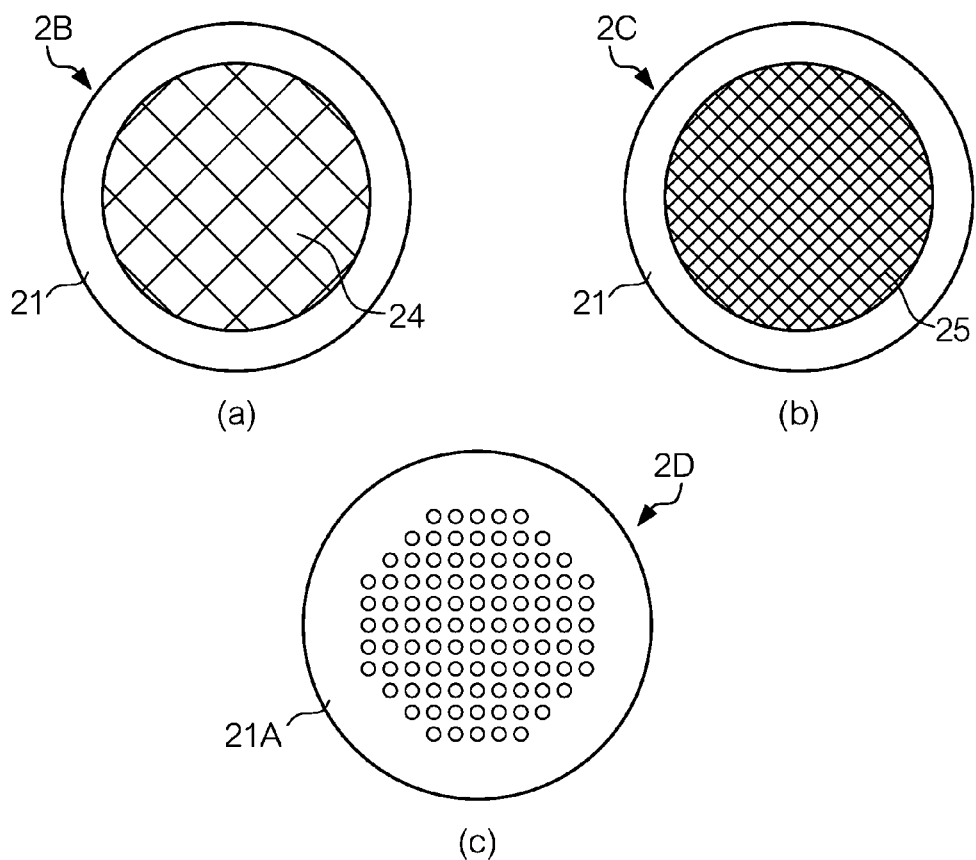
FIG. 6 is a plane view of baffle plates 2B, 2C and 2D.

FIG. 6 is a plane view of baffle plate 2 having another shape. Baffle plate 2B illustrated in FIG. 6(a) has a circular loosely woven mesh part 24 on the opening of disk part 21. When baffle plate 2B is attached to swirl flow-forming body 1, mesh part 24 covers concave part 12 of swirl flow-forming body 1. Baffle plate 2C illustrated in FIG. 6(b) has a circular tightly woven mesh part 25 on the opening of disk part 21. When baffle plate 2C is attached to swirl flow-forming body 1, mesh part 25 covers concave part 12 of swirl flow-forming body 1. Baffle plate 2D illustrated in FIG. 6(c) has a disk part 21A having a plurality of round holes in the centre thereof in place of disk part 21.

In baffle plate 2B, a porous material may be adopted in place of mesh part 24.

2-3. Modified Example 3

Figure 7:
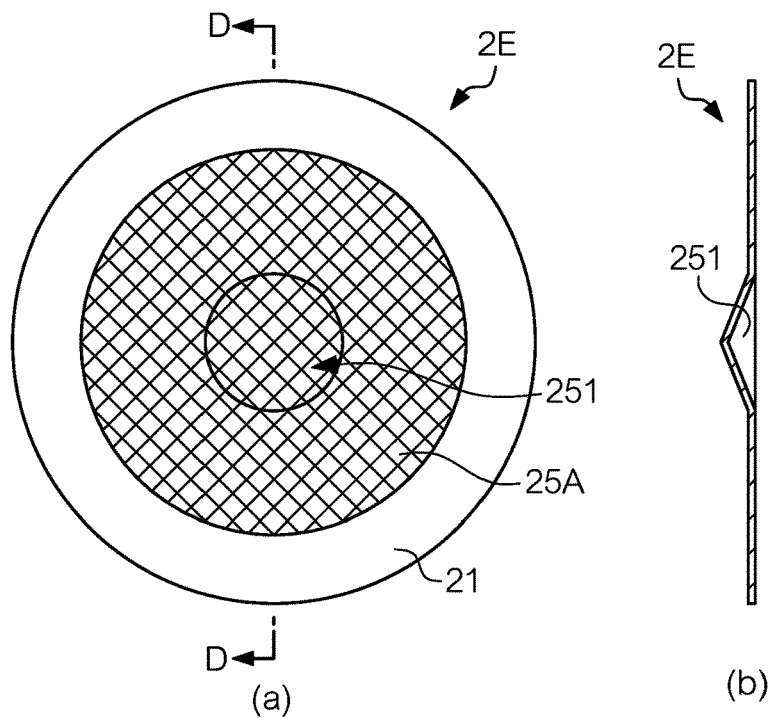
FIG. 7 is a drawing illustrating the structure of a baffle plate 2E.

FIG. 7 is a drawing illustrating the structure of baffle plate 2 having a different shape. FIG. 7(a) is a plane view of baffle plate 2E, and FIG. 7(b) is a cross-sectional view of FIG. 7(a) along line D-D. Baffle plate 2E, as illustrated in FIG. 7, has a circular tightly woven mesh part 25A on the opening of disk part 21. This mesh part 25A has a conical concave part 251 in the centre thereof. Baffle plate 2E is attached to swirl flow-forming body 1 so that concave part 251 is recessed on the concave part 12 side of swirl flow-forming body 1. If a part or the entirety of member W enters or sinks into this concave part 251, movement of member W becomes regulated by the incline surface of mesh part 25A that forms concave part 251, and the position of member W is determined. Since the bottom of concave part 251 is closer to concave part 12 of swirl flow-forming body 1 than other parts of mesh part 25A, the part of member W that has entered or sunk into concave part 251 has suction applied to it more forcefully than other parts. The diameter or depth of concave part 251 is determined in accordance with the shape and size of member W. As a use for baffle plate 2E, applying suction to, holding and conveying machinery components such as bolts or nuts one at a time can be considered.

Figure 8:
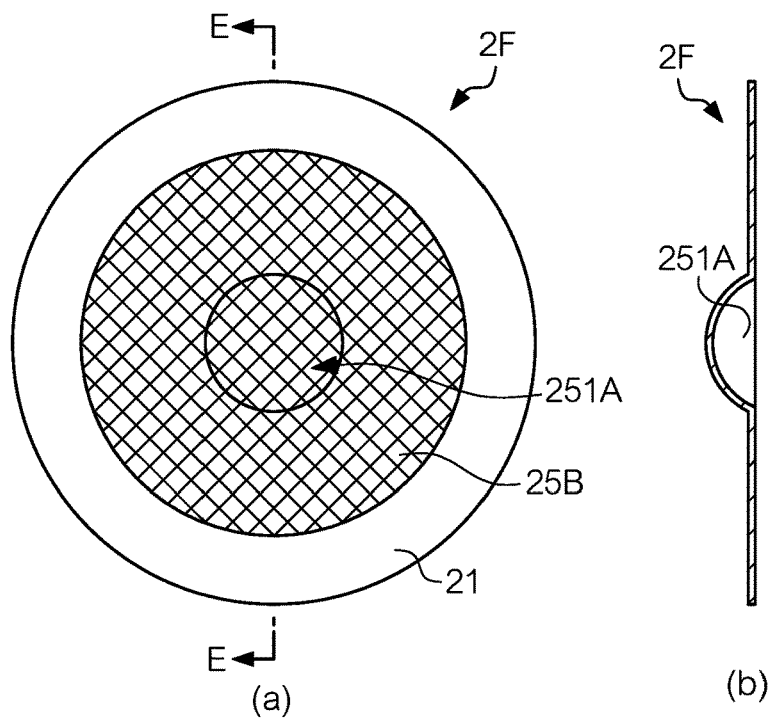
FIG. 8 is a drawing illustrating the structure of a baffle plate 2F.

The shape of concave part 251 may also be determined in accordance with the shape of member W. FIG. 8 is a drawing illustrating the structure of baffle plate 2E having concave part 251 with a different shape. FIG. 8(a) is a plane view of baffle plate 2F, and FIG. 8(b) is a cross-sectional view of FIG. 8(a) along line E-E. Baffle plate 2F, as illustrated in FIG. 8, has a circular tightly woven mesh part 25B on the opening of disk part 21, and this mesh part 25B has a hemispherical concave part 251A in the centre thereof.

Alternatively, the shape of concave part 251 may be groove-like, and arrangement of the direction of a thin and long member W may be made possible.

2-4. Modified Example 4

Figure 9:
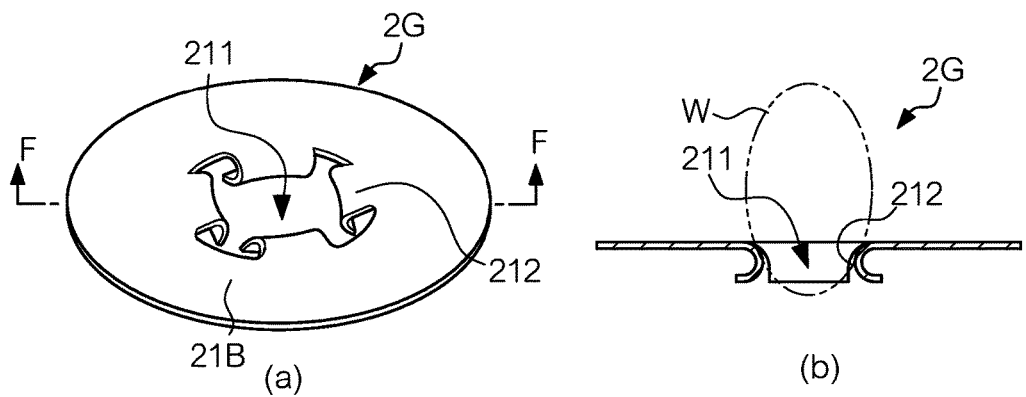
FIG. 9 is a drawing illustrating the structure of a baffle plate 2G.

FIG. 9 is a drawing illustrating the structure of baffle plate 2 having a different shape. FIG. 9(a) is a perspective view of baffle plate 2G, and FIG. 9(b) is a cross-sectional view of FIG. 9(a) along line F-F. Baffle plate 2G has a disk part 21B having an opening 211 in the centre thereof in place of disk part 21. Opening 211 is a through hole. Disk part 21B has four regulation parts 212 at the opening end thereof. Regulation part 212 is formed by subjecting the opening end of disk part 21B to radius bending, for example. Regulation part 212 has an elasticity similar to that of a spring. Baffle plate 2G is attached to swirl flow-forming body 1 so that this regulation part 212 projects to the concave part 12 side of the swirl flow-forming body 1. If a part of member W enters or sinks into opening 211 of baffle plate 2G, movement of member W (movement in the horizontal and vertical directions with respect to baffle plate 2G) becomes regulated by regulation part 212 that surrounds opening 211, and the position of member W is determined. At this time, the part that has entered or sunk into opening 211 is closer to concave part 12 of swirl flow-forming body 1 than other parts, and thus suction is applied to the part with more force. In the present modified example, as illustrated by the broken line in FIG. 9(b), member W is assumed to be made of a spherical or ellipsoid material, such as an egg or a strawberry, for example. The shape and size of opening 211 is determined in accordance with the shape and size of member W.

2-5. Modified Example 5

Figure 10:
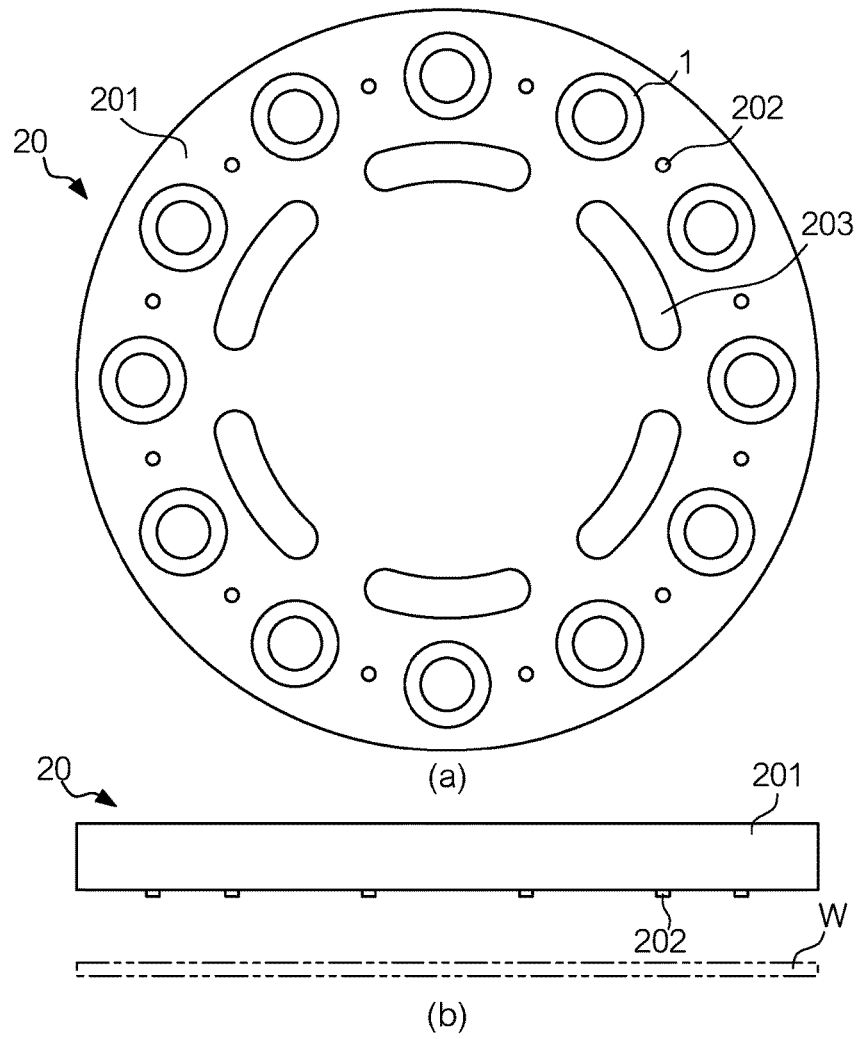
FIG. 10 is a drawing illustrating one example of the structure of conveyance equipment 20.

With regard to suction equipment 10 in the embodiment described above, a plurality of items of suction equipment 10 may be attached to a plate-like frame depending on the size of member W. FIG. 10 is a drawing illustrating one example of the structure of conveyance equipment 20 as in the present modified example. Specifically, FIG. 10(a) is a bottom view of conveyance equipment 20, and FIG. 10(b) is a side view of conveyance equipment 20. Conveyance equipment 20, as illustrated in FIG. 10, is provided with a substrate 201, twelve items of suction equipment 10, twelve friction members 202, and six holes 203.

Substrate 201 has a disk shape. The material of substrate 201 is aluminium alloy, for example. The twelve items of suction equipment 10 are provided on one of the surfaces of substrate 201 (specifically, the surface that opposes member W) (hereafter referred to as "bottom surface"). The twelve items of suction equipment 10 are arranged on the circumference of the same circle on the bottom surface. The twelve items of suction equipment 10 are arranged at equal intervals along the outer periphery of substrate 201. In the present modified example, baffle plate 2 provided in suction equipment 10 may be supported, not by connecting members 3 but by support members that extent vertically from the surface of substrate 201, so that the baffle plate opposes concave part 12.

Each of the twelve friction members 202 has a columnar shape and is provided on the bottom surface of substrate 201. The twelve friction members 202 are arranged on the bottom surface at equal intervals on the circumference of the same circle as the circle on which the items of suction equipment 10 are arranged. One friction member 202 is arranged between two items of suction equipment 10. Each of the friction members 202 comes into contact with the surface of member W and prevents movement of member W due to friction that occurs with the surface. The material of friction members 202 is fluororubber, for example. The six holes 203 are provided on substrate 201 and have an elongated shape with rounded ends. The six holes 203 are arranged at equal intervals on the circumference of the same circle on substrate 201. The circle whose circumference holes 203 are arranged is concentric with the circle on which the items of suction equipment 10 are arranged on the circumference thereof. Holes 203 are arranged further towards the centre of the surface of substrate 201 than suction equipment 10.

2-6. Modified Example 6

In modified example 5 described above, the shape of conveyance equipment 20 may be modified. FIG. 1 is a drawing illustrating one example of the structure of conveyance equipment 30 as in the present modified example.

Figure 11:
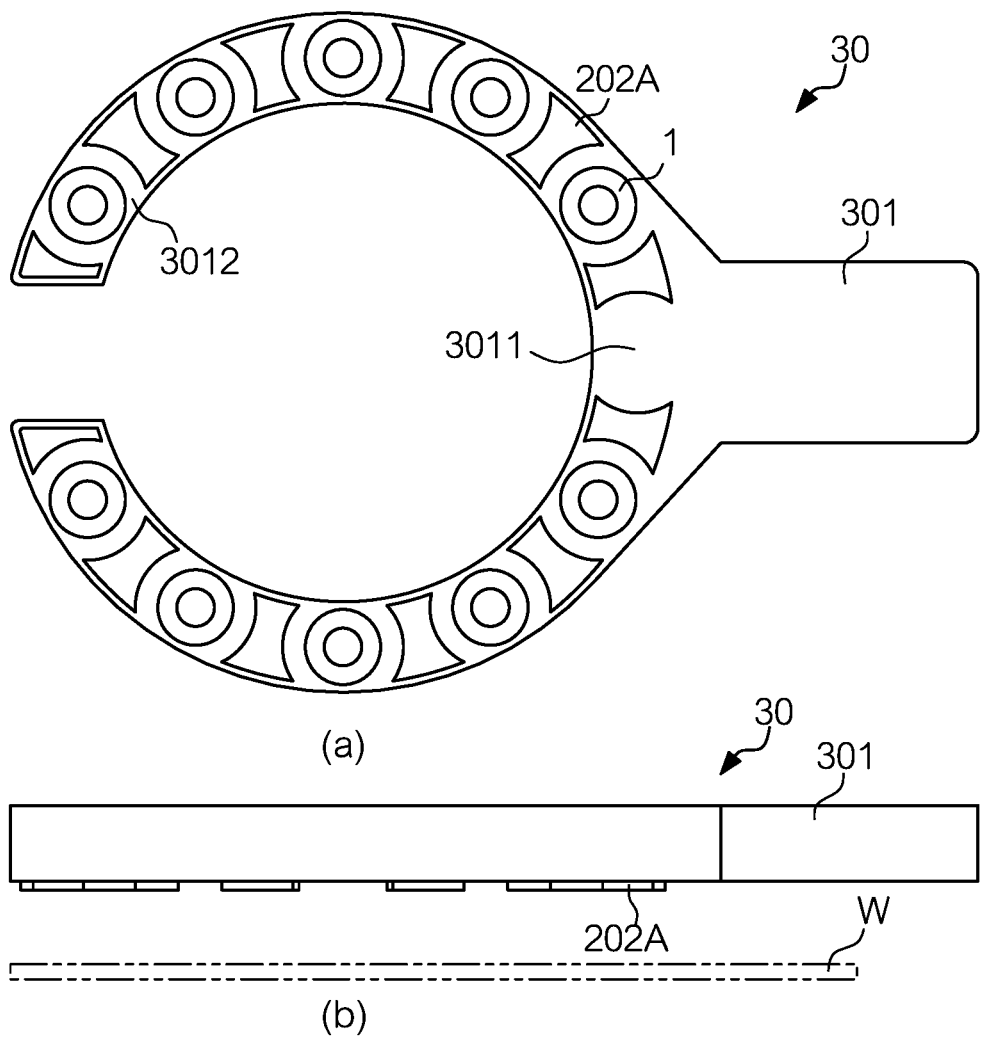
FIG. 11 is a drawing illustrating one example of the structure of conveyance equipment 30.

Specifically, FIG. 11(a) is a bottom view of conveyance equipment 30, and FIG. 11(b) is a side view of conveyance equipment 30. Conveyance equipment 30, as illustrated in FIG. 11, is provided with a substrate 301, ten items of suction equipment 10, and twelve friction members 202A.

Substrate 301 is a plate-like member in the shape of a two-pronged fork, and consists of a rectangular gripping part 3011 and two arms 3012 that branch out from gripping part 3011. The material of substrate 301 is an aluminium alloy, for example. The ten items of suction equipment 10 are provided on one surface of the two arms 3012 (specifically, the surface that opposes member W) (hereafter referred to as "bottom surface") that constitute substrate 301. The ten items of suction equipment 10 are arranged on the circumference of the same circle on the two arms 3012. For each of the arms 3012, five items of suction equipment 10 are arranged at equal intervals. In the present modified example, baffle plate 2 provided in suction equipment 10 may be supported, not by connecting members 3 but by support members that extend vertically from the surface of substrate 301, so that the baffle plate opposes concave part 12.

The twelve friction members 202A are plate-like members, and are provided on the bottom surface of the two arms 3012. The twelve friction members 202A are arranged, on the bottom surface, on the circumference of the same circle as the circle on which the items of suction equipment 10 are arranged. In each of the arms 3012, arrangement is made so that one item of suction equipment 10 is sandwiched by two friction members 202A. Each of friction members 202A comes into contact with the surface of member W and prevents movement of the plate-like member to which suction is to be applied due to friction that occurs with the surface. The material of friction members 202A is fluoro-rubber, for example.

2-7. Modified Example 7

Figure 12:
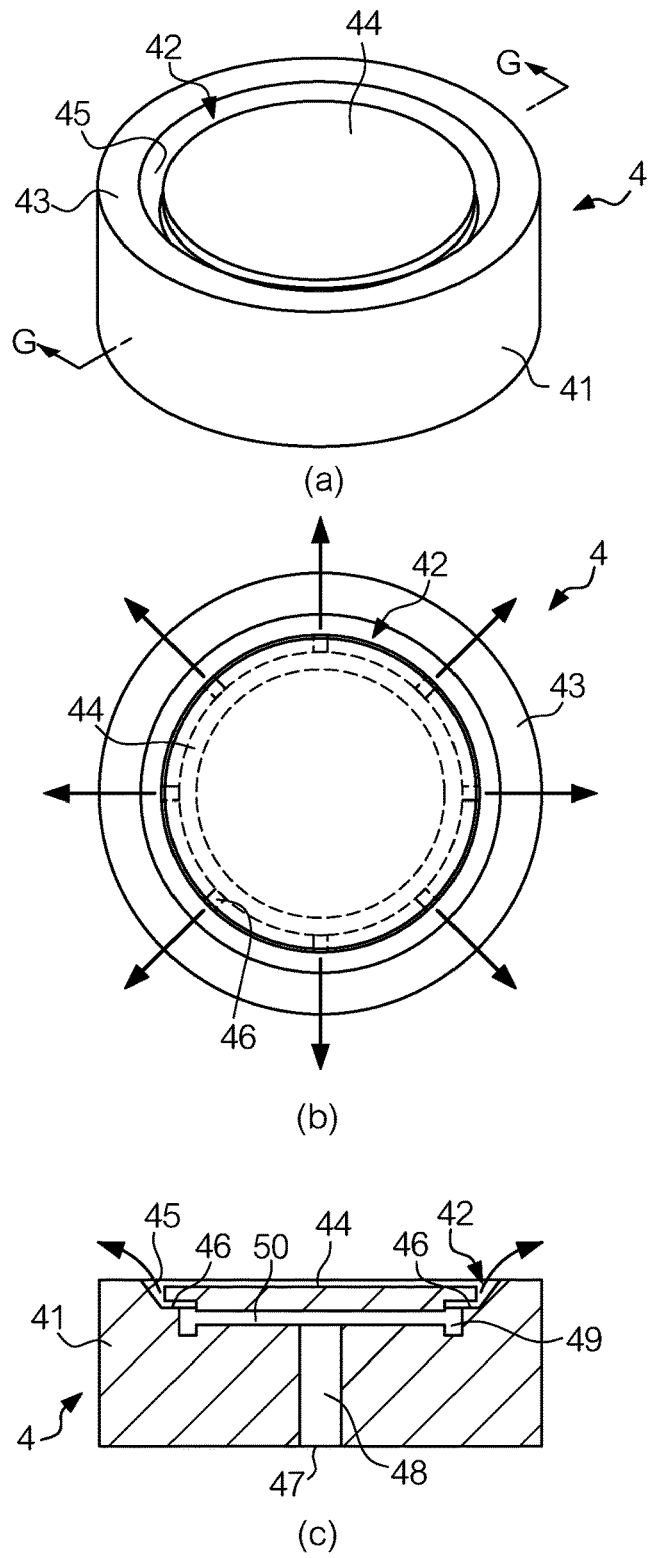
FIG. 12 is a drawing illustrating one example of the structure of a radial flow-forming body 4.

In the embodiment described above, swirl flow-forming body 1 that forms a swirl flow is adopted, but a radial flow-forming body that forms a radial flow may be adopted in place thereof. FIG. 12 is a drawing illustrating one example of the structure of a radial flow-forming body 4 as in the present modified example. FIG. 12(a) is a perspective view of radial flow-forming body 4, FIG. 12(b) is a bottom view of radial flow-forming body 4, and FIG. 12(c) is a cross-sectional view of FIG. 12(b) along line G-G. Radial flow-forming body 4, illustrated in FIG. 12, is equipment that generates negative pressure between radial flow-forming body 4 and member W by discharging fluid, which negative pressure applies suction to and holds the member.

Radial flow-forming body 4, as illustrated in FIG. 12, is provided with a main body 41, an annular concave part 42, an end face 43, an opposing surface 44, and an incline surface 45. Main body 41 has a columnar shape. End face 43 is formed in a flat shape on one of the surfaces of main body 41 (specifically, the surface that faces member W) (hereafter referred to as "bottom surface"). Annular concave part 42 is formed on end face 43. Annular concave part 42 is formed in a circle concentric with the outer periphery of main body 41. Opposing surface 44 is formed in a flat shape on the bottom surface of main body 41. Opposing surface 44 is surrounded by annular concave part 42 and opposes member W, which is an article to be conveyed. Opposing surface 44 is formed on the bottom surface of main body 41 so as to be concave with respect to end face 43. Incline surface 45 is formed at the opening of annular concave part 42 (specifically, the outer-peripheral edge thereof).

Radial flow-forming body 4 is further provided with six nozzle holes 46, an introduction port 47, an introduction path 48, an annular passage 49 and a communication passage 50. Introduction port 47 is circular and is provided in the centre of the top surface of main body 41 (that is, the surface opposite the bottom surface). Introduction port 47 is connected to a fluid supply pump, which is not illustrated, via a tube, for example. Introduction path 48 is provided inside main body 41, and extends in a straight line along the central axis of main body 41. Introduction path 48 communicates with introduction port 47 at one end thereof, and communicates with communication passage 50 at the other end thereof. Introduction path 48 supplies communication passage 50 with fluid that is supplied into main body 41 via introduction port 47.

Communication passage 50 is provided inside main body 41, and extends in a straight line in the radial direction of annular passage 49. Communication passage 50 communicates with introduction path 48 at the central part thereof in the axial direction, and communicates with annular passage 49 at both ends thereof. Communication passage 50 supplies annular passage 49 with fluid that is supplied from introduction path 48. Annular passage 49 is cylindrical, and is provided inside main body 41. Annular passage 49 is formed on the same axis as main body 41. Annular passage 49 supplies nozzle hole 46 with fluid that is supplied from communication passage 50.

Each of the six nozzle holes 46 is formed so as to be approximately parallel to end face 43 or opposing surface 44 and extend in a straight line in the radial direction of the bottom surface or top surface of main body 41, one end thereof communicating with annular passage 49 and the other end communicating with annular concave part 42. The six nozzle holes 46 are arranged on the same plane so that lines extending radially from the center of radial flow-forming body 4 through adjacent nozzle holes 46 form an approximately 45 degree angle with each other. Each of nozzle holes 46 discharges fluid such as a gas into annular concave part 42 and forms a radial flow. Each of nozzle holes 35 is one example of the "fluid flow forming means" in the present invention.

If radial flow-forming body 4 explained above is supplied with fluid via introduction port 47, the fluid passes through introduction path 48, communication passage 50 and annular passage 49 before being discharged from nozzle holes 46 into annular concave parts 42. Fluid discharged into annular concave part 42 flows out of the opening of annular concave part 42. At this time, if member W is present opposite baffle plate 2, inflow of external fluid (for example, air or water) to the space between baffle plate 2 and member W is restricted, and the density of fluid molecules per unit volume in the space becomes reduced due to the entrainment effect of the radial flow, generating negative pressure. As a result, pressure is applied to member W by surrounding fluid and member W gravitates towards baffle plate 2.

The structure of radial flow-forming body 4 (in particular, the number of nozzle holes 46 and structure of the fluid flow path within main body 41) is not limited to the structure in the example indicated in the present modified example. The structure may be determined in accordance with the size, shape and material of member W that is conveyed by radial flow-forming body 4.

2-8. Modified Example 8

Figure 13:
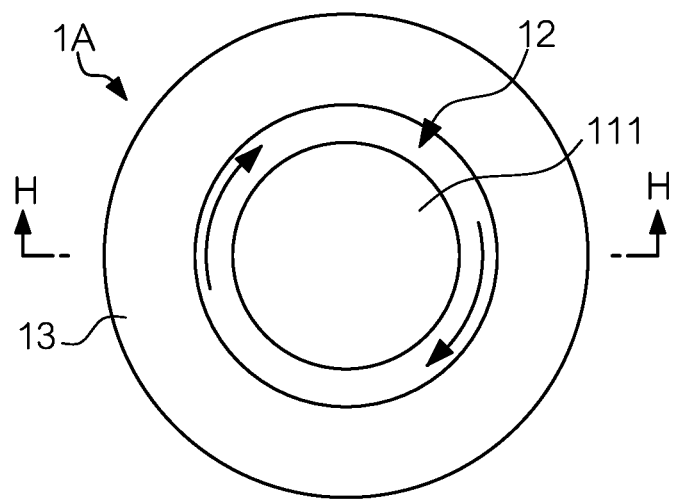
FIG. 13 is a drawing illustrating one example of the structure of a swirl flow-forming body 1A.
Figure 13:
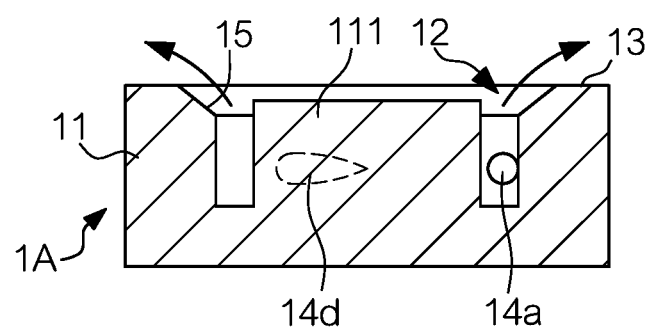

The shape of swirl flow-forming body 1 in the embodiment described above may be modified. FIG. 13 is a drawing illustrating one example of the structure of swirl flow-forming body 1A as in the present modified example. FIG. 13(a) is a bottom view of swirl flow-forming body 1A, and FIG. 13(b) is a cross-sectional view of FIG. 13(a) along line H-H. Swirl flow-forming body 1A, as illustrated in FIG. 13, is further provided with a convex part 111 compared to swirl flow-forming body 1. Convex part 111 has a columnar shape, and is formed so as to extend from the bottom of concave part 12. Convex part 111 is formed on the same axis as main body 11 or concave part 12. The top surface of convex part 111 (specifically, the surface that opposes member W) is formed so as to be concave with respect to end face 13. Convex part 111 forms a fluid flow path between the outer-peripheral side surface thereof and the inner-peripheral side surface of main body 11, and fluid discharged into concave part 12 forms a swirl flow by flowing through this fluid flow path.

The top surface of convex part 111 may be formed on the same plane as end face 13. The end part of the top surface of convex part 111 may be chamfered.

2-9. Modified Example 9

Figure 14:
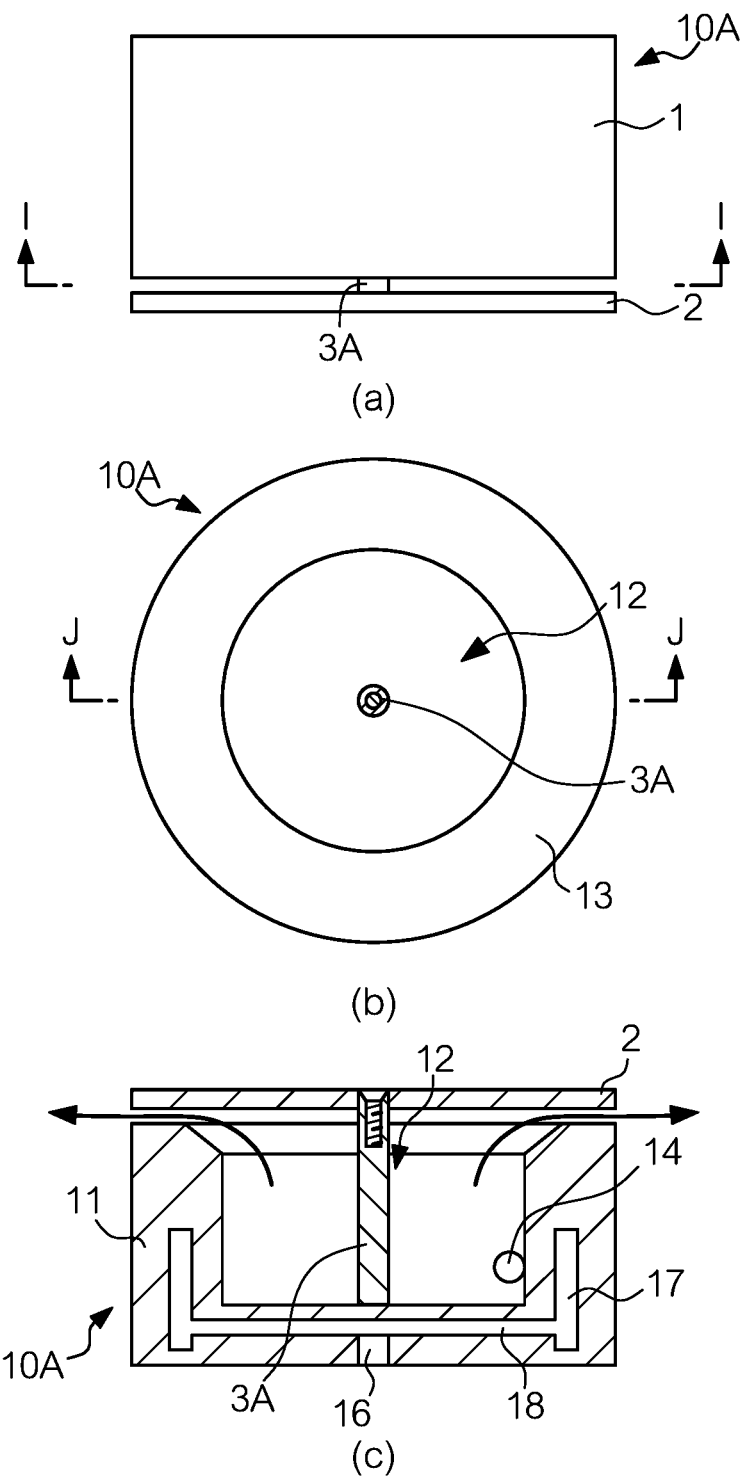
FIG. 14 is a drawing illustrating one example of the structure of suction equipment 10A.

The shape of connecting members 3 provided in suction equipment 10 as in the embodiment described above is not limited to a columnar shape, and may be a square pillar shape or an elliptical columnar shape. The number of connecting members 3 is not limited to four, and may be fewer or may be more. Connecting members 3 may connect the bottom surface of concave part 12 with baffle plate 2 rather than end face 13 of swirl flow-forming body 1. FIG. 14 is a drawing illustrating one example of the structure of suction equipment 10A having such a structure. FIG. 14(a) is a side view of suction equipment 10A, FIG. 14(b) is a cross-sectional view of FIG. 14(a) along line I-I, and FIG. 14(c) is a cross-sectional view of FIG. 14(b) along line J-J.

Suction equipment 10A illustrated in FIG. 14 differs from suction equipment 10 in a feature of having connecting members 3A in place of connecting members 3. In suction equipment 10A, connection members 3A are columnar spacers. One of the surfaces of each of connection members 3A is fixed to the bottom surface of concave part 12, and the other surface is fixed to the centre of one of the surfaces of baffle plate 2 (specifically, the surface on the side that opposes end face 13). As a result, main body 11 and baffle plate 2 are connected via connecting members 3A. Connecting members 3 extend from the centre of the bottom surface of concave part 12 towards baffle plate 2, and a swirl flow is formed around connecting members 3A. Connecting members 3A are arranged in the centre of concave part 12, and thus do not obstruct the flow of fluid that flows out of concave part 12 (that is, the flow path formed between end face 13 and baffle plate 2).

Similarly to connecting members 3, connecting members 3A form, between end face 13 and baffle plate 2, a flow path for fluid to flow out of concave part 12. This flow path is formed parallel to end face 13 and baffle plate 2, and fluid that flows out of concave part 12 flows along this flow path (that is, flows parallel to the end face 13 and the surface of disk part 21), before flowing out of suction equipment 10A. Fluid that passes through this flow path does not flow out of the opening of baffle plate 2.

The height of connecting members 3A (that is, the sum of the depth of concave part 12 and the gap between end face 13 and baffle plate 2) is set in accordance with an amount of fluid supplied from a fluid supply pump to suction equipment 10A. For example, the height is set so that fluid that flows out of concave part 12 passes through the flow path formed between end face 13 and baffle plate 2 by connecting members 3A without passing through the opening of baffle plate 2. At this time, the height of connecting members 3A is preferably as low as possible so that the suction power of suction equipment 10A does not decrease.

2-10. Modified Example 10

In the embodiment described above, a well-known electric fan may be adopted in place of swirl flow-forming body 1 (for example, refer to published unexamined patent application number 2011-138948). Specifically, a configuration may be adopted in which an intake port is provided in main body 11 of swirl flow-forming body 1, and a fan that rotates to apply suction to gas from the intake port into concave part 12 and to generate a swirl flow within concave part 12 is provided inside concave part 12. This fan is one example of the "fluid flow forming means" in the present invention.

2-11. Modified Example 11

The shape of main body 11 of swirl flow-forming body 1 as in the embodiment described above is not limited to being columnar, and may be a square or elliptical columnar shape. The number of supply paths 19 provided in swirl flow-forming body 1 is not limited to two, and may be fewer or may be more. Incline surface 15 may not necessarily be provided (that is, the end part of end face 13 may not necessarily be chamfered). Further, swirl flow-forming body 1, baffle plate 2 and connecting members 3 may be integrally formed. The number of rod-like members 22 and annular members 23 of baffle plate 2 may be one or may be three or more. The radius of baffle plate 2 may not necessarily be the same as the cross-sectional radius of main body 11.

2-12. Modified Example 12

The structure of substrate 201 of conveyance equipment 20 described above is not limited to the structure in the example indicated in modified example 5 described above. The number, shape and arrangement of friction members 202 and holes 203 provided on substrate 201 of conveyance equipment 20 are not limited to those in the example indicated in modified example 5 described above. These elements may be determined in accordance with the size, shape and material of member W conveyed by conveyance equipment 20. Friction members 202 and holes 203 may not necessarily be provided on substrate 201 of conveyance equipment 20. If friction members 202 are not provided on substrate 201 of conveyance equipment 20, a well-known centering guide may be arranged on substrate 201 to determine the position of member W (for example, refer to published unexamined patent application number 2005-51260). Similarly, the structure of substrate 301 of conveyance equipment 30 described above is not limited to the structure indicated in modified example 6 described above.

2-13. Modified Example 13

The number, structure and arrangement of items of suction equipment 10 provided on substrate 201 of conveyance equipment 20 are not limited to those in the example indicated in modified example 5 described above. These elements may be determined in accordance with the size, shape and material of member W conveyed by conveyance equipment 20. For example, the number of items of suction equipment 10 may be fewer or more than twelve. Items of suction equipment 10 may be arranged in two or more rows along the outer periphery of substrate 201. Similarly, the number, structure and arrangement of items of suction equipment 10 provided on substrate 301 of conveyance equipment 30 described above are not limited to those in the example indicated in modified example 6 described above.

The invention claimed is:

1. Suction equipment comprising:
a columnar main body;
a flat end face formed at the main body;
a concave part formed at the end face;
a fluid flow-forming means for forming a fluid swirl flow in the concave part or forming a radial flow by discharging fluid into the concave part, the fluid swirl flow or the radial flow generating negative pressure that applies suction to a member;
a baffle plate including a hole formed at a center of the baffle plate such that the hole opens toward the member, the hole allowing the fluid, to which suction has been applied due to the negative pressure, to pass through and prevent the member from entering the concave part; and
at least one support member supporting the baffle plate so that the baffle plate opposes the concave part, the at least one support member forming a flow path for the fluid to flow out of the concave part between the end face and the baffle plate.

2. The suction equipment according to claim 1, wherein:
the at least one support member projects from the end face and connects the main body and the baffle plate; and
the at least one support member is arranged such that the at least one support member does not obstruct the flow path.

3. The suction equipment according to claim 2, wherein all of the at least one support member is arranged in a position such that none of the at least one support member obstructs the flow path.

4. The suction equipment according to claim 1, wherein the at least one support member connects a bottom surface of the concave part and the baffle plate.

5. The suction equipment according to claim 1, wherein the baffle plate includes a concave part or the hole into which a part of the member, to which suction has been applied due to the negative pressure, enters so that a position of the member is determined.

6. The suction equipment according to claim 1, wherein the at least one support member supports the baffle plate so that the baffle plate opposes the concave part and the end face, and the at least one support member forms the flow path in a space between the end face and the baffle plate.

7. The suction equipment according to claim 1, wherein the baffle plate includes a mesh part having a concave part a center of the mesh part, the concave part of the mesh part opens toward the member to which suction is applied due to the negative pressure.

8. The suction equipment according to claim 1, wherein the at least one support member forms a gap between the end face and the baffle plate, the gap allowing fluid flowing out of the concave part to flow, the at least one support member being positioned within the gap.

* * * * *